United States Patent [19]

Roy

[11] Patent Number: 5,159,518
[45] Date of Patent: Oct. 27, 1992

[54] INPUT PROTECTION CIRCUIT FOR CMOS DEVICES

[75] Inventor: Richard S. Roy, Pleasanton, Calif.

[73] Assignee: VLSI Technology, Inc., San Jose, Calif.

[21] Appl. No.: 466,158

[22] Filed: Jan. 17, 1990

[51] Int. Cl.$^5$ .............................................. H02H 9/04
[52] U.S. Cl. ...................................... 361/56; 361/91; 361/58; 357/23.13
[58] Field of Search ................... 361/111, 91, 58, 56; 357/23.13

[56] References Cited

U.S. PATENT DOCUMENTS 4,930,037  5/1990  Woo ....................................... 361/58

Primary Examiner—Todd E. DeBoer
Attorney, Agent, or Firm—Flehr, Hohbach, Test, Albritton & Herbert

[57] ABSTRACT

An input protection circuit protects MOS semiconductor circuits from electrostatic discharge voltages and from developing circuit latchup. The input protection circuit includes a low resistance input resistor, and two complementary true gated diodes. One true gated diode has a P-doped node coupled to the input node, and a gate and N-doped node coupled to a high voltage power supply node. The other true gated diode has a N-doped node coupled to the input node, and a gate and P-doped node coupled to a second power supply node.

18 Claims, 4 Drawing Sheets

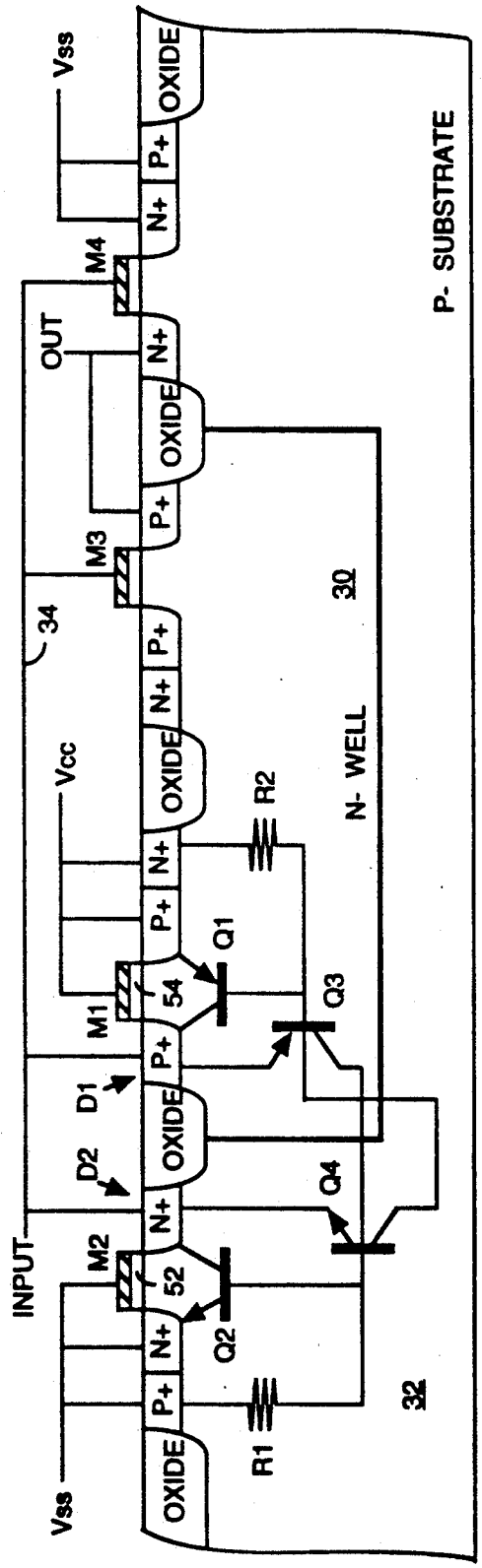
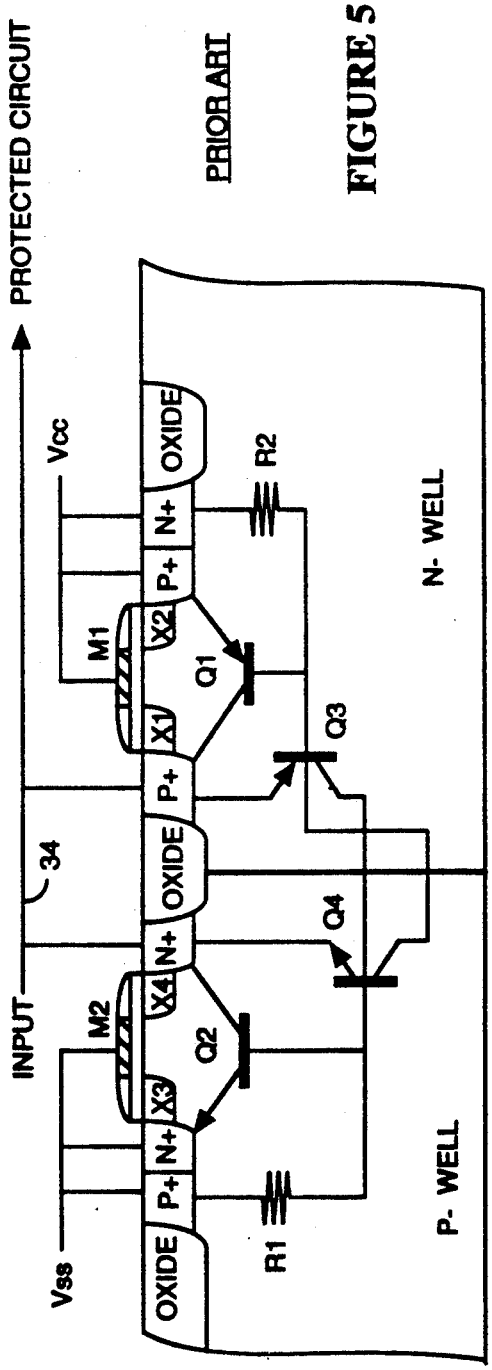
FIGURE 4
PRIOR ART
FIGURE 5
PRIOR ART

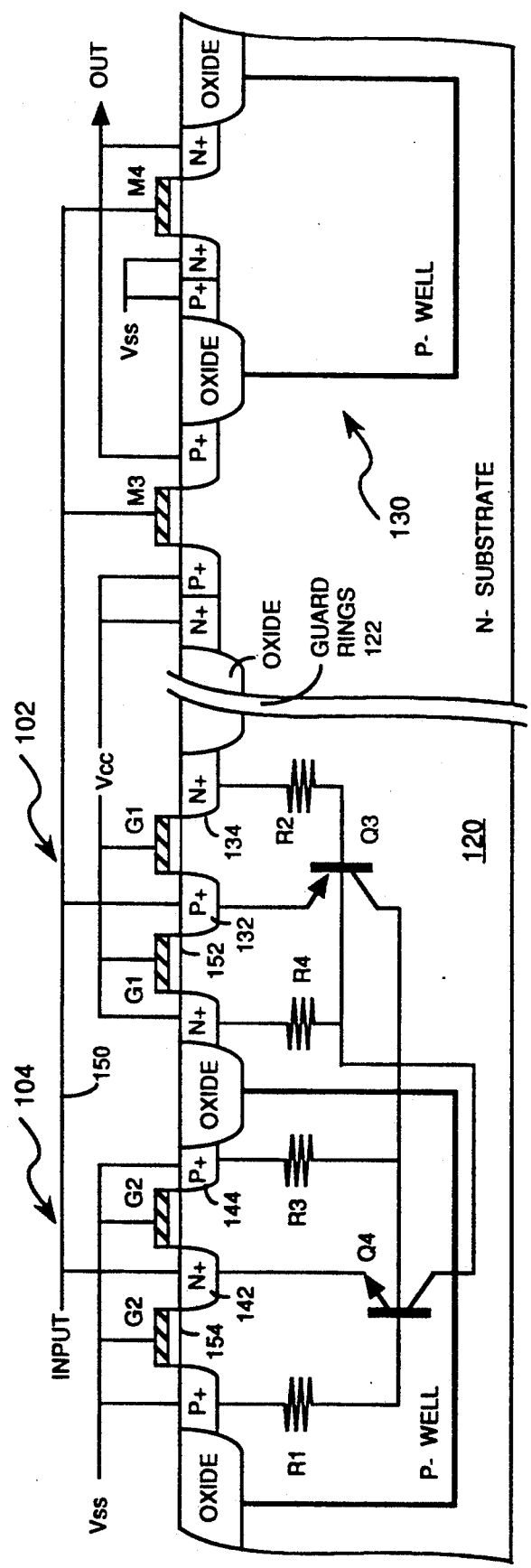

INPUT PROTECTION CIRCUIT FOR CMOS DEVICES

The present invention relates generally to MOS semiconductor circuits, and particularly to input protection circuits for protecting MOS semiconductor devices from large electrostatic discharge voltages as well as input currents that may cause latchup.

BACKGROUND OF THE INVENTION

The purpose of an input protection circuit is to protect input gates, diffusions, metal lines, and other components from the potentially destructive effects of large electrostatic discharge (ESD) voltages applied to an input pad. Input protection circuits for CMOS integrated circuits must also prevent latchup—a circuit condition in which parasitic bipolar transistors short circuit the device's power supply and cannot be turned off without turning off the power supplied to the entire circuit.

Input protection circuits are typically formed along the periphery of semiconductor circuits, generally next to the input pads of the circuit. Each input protection circuit couples an input pad to circuitry in the interior portion of the semiconductor circuit.

Many different input protection circuits exist. Referring to FIG. 1, most such circuits use a combination of resistors, diodes and MOSFETs.

Input Resistors. As shown in FIG. 1, most prior art input protection circuits use a series input resistor RI to reduce the ESD (electrostatic discharge) voltage by dropping some of the voltage across the resistor. The input resistor also reduces the latchup current. The value of the input resistors used in the prior art ranges from as high as 2k ohm to as low as 20 ohms.

A well-known problem associated with the use of input resistors is an input RC delay. In particular, the capacitance of the metal line from an input pad to an input gate is typically 1 to 2 pf (picofarads). With an input resistance between 1K and 2K ohms, the input RC delay will between 1 and 4 nanoseconds. For a high speed part with a 10 to 20 nanosecond access time, this delay is not acceptable. Therefore smaller input resistors, in conjunction with one or more diodes, must be used in high speed circuits to absorb ESD voltages. As will be described below, the present invention allows the input resistor RI to be either completely eliminated or reduced to a nominal value.

Input Diodes. Diodes are often used to provide a nondestructive path for ESD currents. The parasitic series resistance of the diodes, however, can reduce the amount of current shunted by the diodes. To reduce this resistance, large area diodes are sometimes used, which increases the die area and capacitance of the input protection circuit. Epitaxial layers are also used in some circuits to reduce the parasitic resistance.

ESD Test Circuit. Referring to FIG. 2, input protection circuits are typically tested using a test circuit such as circuit 22. In the test circuit 22 shown, a storage capacitor C1 of 200 picofarads is used, with a series resistor RT of 1500 ohms. Thus the time constant of this test circuit is 300 nanoseconds.

The test circuit 22 is used as follows. Voltage source V1 is generally a controllable voltage source which can generate any selected voltage level in a predefined range, such as −5000 to +5000 volts. A selected voltage level, such as +2000 volts is placed on capacitor C1 by operating the voltage source V1 at the selected voltage level and then temporarily closing switch SW1. Once the capacitor C1 is charged, the stored charge is delivered to the PAD by opening switch SW1 and then closing switch SW2.

The test circuit shown in FIG. 2 is sometimes called the "human body" model, because it simulates the effect of a person accumulating a static charge and then touching an integrated circuit. Another commonly used test circuit, sometimes called the machine model, eliminates resistor RT in the test circuit 22, simulating the coupling of an integrated circuit to a machine with an accumulated static charge.

Referring again to FIG. 1, most input protection circuits use only a single input diode (or several parallel diodes of the same type) to absorb ESD voltages. However, problems with the use of a single input diode can arise when an ESD voltage reverse biases the diode. The diode clamps the input voltage at its reverse break down voltage. Unfortunately, the reverse break down voltage of the diode is typically higher than the breakdown voltage of the device's transistor gates. Therefore the input gates may be destroyed before the diode reacts.

Complementary Input Diodes. FIG. 3 depicts the schematic of an input protection circuit which is similar to the one in FIG. 1, but which uses two complementary input diodes D1 and D2 and two MOS transistors M1 and M2.

FIG. 3 also depicts a portion of the bipolar model, with transistors Q1 and Q1, for the CMOS circuit in FIG. 3. The primary motivation for using two complementary input diodes and their associated transistors is to facilitate the absorption of both positive and negative voltage ESD voltages and currents.

More specifically, upon the occurrence of an ESD, one of the two diode and MOS transistor pairs (depending on the polarity of ESD voltage) will turn on at the forward turn on voltage of the diode (approximately 0.7 volts). The bulk of the ESD current will go through the forward biased diode.

If the ESD voltage rises fast enough, the reverse biased diode will absorb some, but not all of the current, thereby helping to prevent the input voltage from reaching the gate oxide breakdown voltage of the device's transistor gates. For fast input voltage rise times, characteristic of ESD, the response time of the forward biased diode will be too slow to keep the input voltage near 0.7 volts, and therefore the breakdown voltage of the reverse biased diode will be reached. Fortunately, the breakdown voltage of gated diodes is lower than the gate oxide breakdown voltage. Therefore the reverse biased diode will absorb a portion of the ESD current and will help to protect the CMOS gates of the protected circuit. In addition, one of the two parasitic lateral bipolar transistors Q1 or Q2 will be turned on by the ESD input voltage, causing current to flow under the gate oxide of corresponding MOS transistor.

FIG. 4 shows a profile of a typical implementation of the input protection circuit shown in FIG. 3. FIG. 4 also shows the full bipolar model for the circuit, including two lateral bipolar transistors Q1 and Q2, and two vertical bipolar transistors Q3 and Q4. Note that D1 in FIG. 3 represents the PN junction between the input signal line 34 and N-well 30 in FIG. 4, and that D2 in FIG. 3 represents the NP junction between the input line and the substrate 32.

There are two serious disadvantages of the input protection circuit shown in FIGS. 3 and 4: destruction of the gate oxide 52 or 54 of M1 or M2 caused by shunting large ESD currents through the lateral parasitic bipolar transistor Q1 or Q2, and a latchup problem (also called a snap-back voltage problem) associated only with positive ESD voltages.

The gate oxide problem occurs in the following way. A positive ESD voltage will turn on bipolar transistor Q1 and a negative ESD voltage will turn on bipolar transistor Q2. Significant amounts of current will be shunted by the enabled transistor Q1 or Q2 along a path that is directly below the corresponding gate oxide 52 or 54. The high current densities near the surface of the substrate, caused by Q1 or Q2 shunting ESD currents, can heat and destroy the neighboring gate oxide 52 or 54.

Referring to FIG. 4, the snap-back problem occurs as follows. When a positive ESD voltage is encountered, the diode comprising the emitter-base junction of Q3 is forward biased, turning on vertical bipolar transistor Q3. As the ESD voltage rises, this will cause the voltage on the substrate node 32 to rise, causing transistor Q2 to turn on. When Q2 turns on, an SCR condition exists with transistors Q3 and Q2 both drawing current from the input signal line 34. As a result, the input voltage can be pulled below Vcc, which is considered to be an undesirable result. The sudden voltage drop on the input signal line caused by transistor Q2 being turned on is herein called a "snap-back" effect. At even higher current levels, true latchup can occur due to the triggering effect of this input SCR on other parasitic bipolar transistors.

In summary, the input protection devices currently in use have been less than satisfactory because they provide insufficient protection against large electrostatic discharges.

It is therefore a primary object of the present invention to provide an improved input protection device that can absorb large ESD voltages and currents and avoids the problems of gate oxide destruction and snap-back associated with prior art input protection circuits using complementary input diodes.

Another object of the present invention is to provide an input protection circuit using complementary input diodes which protects MOS and CMOS gates from even momentary exposure to voltages sufficient to destroy such gates.

SUMMARY OF THE INVENTION

In summary, the present invention is an input protection circuit for protecting MOS semiconductor circuits from electrostatic discharge voltages and from developing circuit latchup. The input protection circuit includes a low resistance input resistor and a pair of complementary true gated diodes. In the present invention a true gated diode is defined to be an MOS structure having a gate and a drain, but no source. That is, there is no source region of the same doping polarity as the drain. Each true gated diode has an associated vertical parasitic bipolar transistor which can help to dissipate electrostatic discharges. However, these true gated diodes do not have a lateral parasitic bipolar transistor under the gate oxide, which reduces the amount of stress on the gated diodes' gate oxide.

BRIEF DESCRIPTION OF THE DRAWINGS

Additional objects and features of the invention will be more readily apparent from the following detailed description and appended claims when taken in conjunction with the drawings, in which:

FIG. 4 depicts the profile and parasitic bipolar transistor model of a prior art input protection circuit.

FIG. 5 schematically depicts the profile and parasitic bipolar transistor model of a second prior art input protection device.

FIGS. 6A and 6B schematically depict two preferred embodiments of an input protection device in accordance with the present invention.

FIG. 7 depicts the profile and parasitic bipolar transistor model of the circuit shown in FIG. 6A.

DESCRIPTION OF THE PREFERRED EMBODIMENT

Before describing the present invention it is useful to consider the profile and parasitic bipolar transistor model of two prior art input protection circuits. The present invention will then be described in terms of the differences between the present invention and these prior art circuits.

Figure 1:
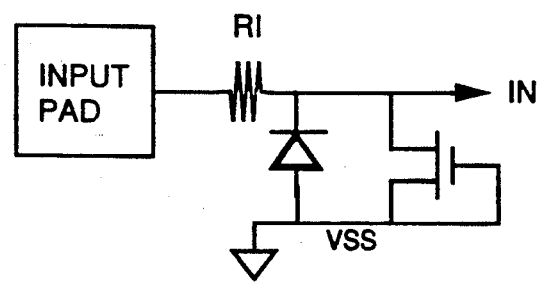
FIG. 1 depicts a prior art input protection device.
Figure 2:
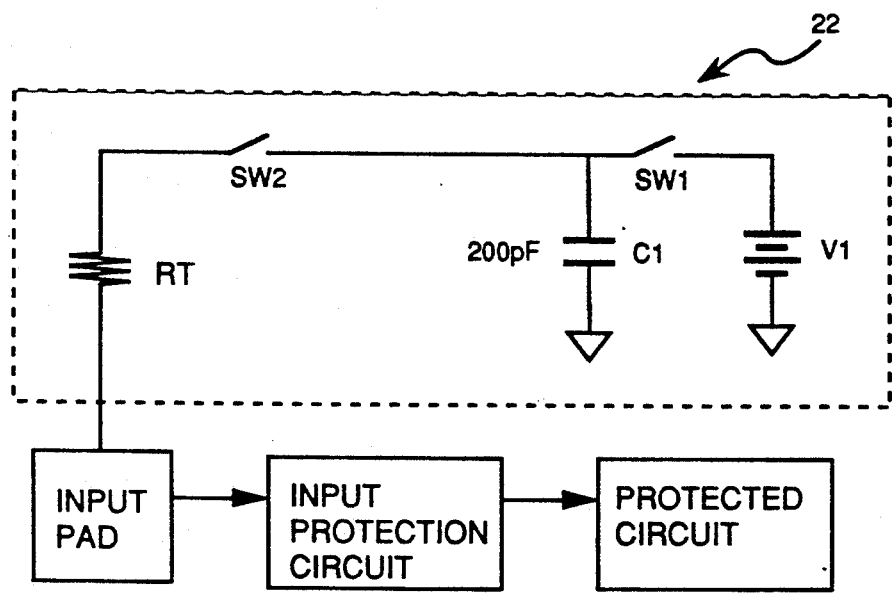
FIG. 2 is a schematic of an electrostatic discharge test circuit.
Figure 3:
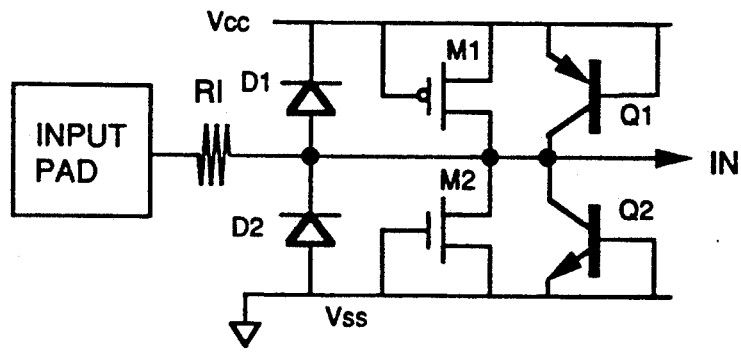
FIG. 3 depicts a prior art input protection circuit using complementary input diodes, and the corresponding parasitic bipolar transistor model.

FIG. 4 shows a circuit profile for the circuit shown in FIG. 3, excluding the input transistor. The design of input transistors is well known in the prior art and therefore not included in the circuit profiles shown in FIGS. 4, 5 and 7.

For the purposes of this description, the term Vcc refers to the high voltage source used in a circuit (e.g., 5 volts in many circuits) and Vss refers to the low voltage source used in the circuit (e.g., 0 volts, or ground).

It should also be understood that the circuit profiles shown in FIGS. 4, 5, and 7 are not drawn to scale, so that the relevant features can be more clearly represented. Furthermore, the parasitic bipolar devices shown in these profiles represent or model the operation of these circuits in certain circumstances—they do not represent additional components of the circuit.

In FIG. 4 transistors M1 and M2 correspond to transistors M1 and M2 in FIG. 3. Parasitic bipolar transistors Q1 and Q2 in FIG. 4 correspond to the similarly labeled transistors in FIG. 3. Transistors Q3 and Q4 are vertical bipolar transistors which are associated with MOS transistors M1 and M2, respectively. Resistors R1 and R2 model the bulk resistance and effective well resistance of the substrate on which the circuit is formed.

Transistors M3 and M4 are an example of a CMOS inverter inside the protected circuit. The output signal OUT is the inverted input signal. While the circuit profile in FIG. 4 does not include a guard ring to prevent latchup, it should be assumed that one or more guard rings would be inserted between transistors M1-M2 and transistors M3-M4.

FIG. 5 depicts another prior art circuit that is disclosed in U.S. Pat. No. 4,760,433. This circuit is similar to the circuit of FIG. 4, with the addition of regions X1, X2. X3 and X4 under the gates of M1 and M2. Regions X1-X4 serve two purposes: (1) to protect the edges of the gate oxides under gates M1 and M2 from overheating when ESD currents are shunted through the corresponding lateral bipolar devices Q1 and Q2, and (2) to increase the efficiency of the parasitic bipolar transistors Q1 and Q2 so that these transistors can absorb larger ESD currents than the circuit in FIG. 4. While this is an improvement over the circuit of FIG. 4, the currents which flow through transistors Q1 and Q2 nevertheless stress the gate oxides of transistors M1 and M2 and thereby destroy those gate oxides and cause failures of the circuit. While this danger is somewhat reduced by the circuit in FIG. 5, the problem is not eliminated. In addition, the circuit in FIG. 5 actually magnifies the above described "snap-back" problem associated with positive voltage ESDs, because of the increased efficiency of the lateral parasitic bipolar transistors.

True Gated Diode Protection Circuit

Referring to FIG. 6A, there is shown an input protection circuit 100 in accordance with the present invention. This circuit 100 consists of two complementary true gated diodes 102 and 104. True gated diode 102 has its P-doped side coupled to the input node IN. Its gate and N-doped side are coupled to the Vcc voltage source node, which carries the higher voltage of the two reference voltages Vcc and Vss.

True gated diode 104 has its N-doped side coupled to the input node IN. Its gate and P-doped side are coupled to the Vss voltage source node. Vss is sometimes called the ground node.

An important characteristic of the true gated diodes 102 and 104 is that the gate voltage reduces the diode's breakdown voltage. That is, the breakdown voltage of the diodes 102 and 104 is less when a gate voltage is applied than when the diode is not gated. As a result, when an ESD occurs, the reverse biased diode 102 or 104 turns on at a relatively low voltage below the gate oxide rupture voltage, which helps to limit the peak voltage on the input line IN, and thereby protects CMOS gates coupled to the input line IN from excessive voltages.

Referring to FIGS. 8A-8D, a true gated diode is defined to be an MOS structure having a gate and a "drain", but no "source". The drain has a polarity which is the opposite of the neighboring substrate or well in which the gated diode is located, thereby forming a PN diode junction which is gated by the neighboring MOS gate. The "source" side of a true gated diode is either (1) doped with the same polarity as the neighboring substrate and coupled to the same voltage source as that substrate, or (2) eliminated. Alternately, a true gated diode can be defined to mean a gated diode that does not have an associated lateral bipolar transistor.

Figure 8A:
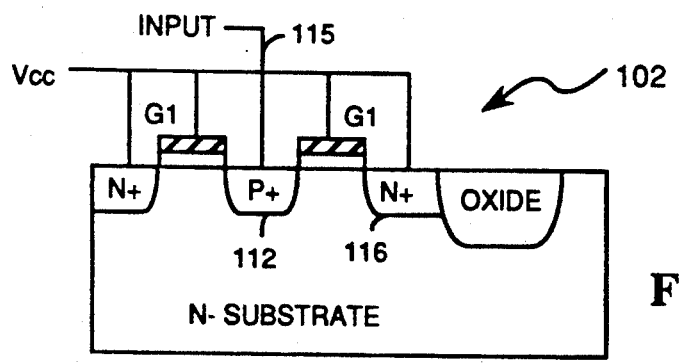
FIGS. 8A, 8B, 8C and 8D depicts the profiles of four preferred embodiments of true gated diodes in accordance with the present invention
Figure 8B:
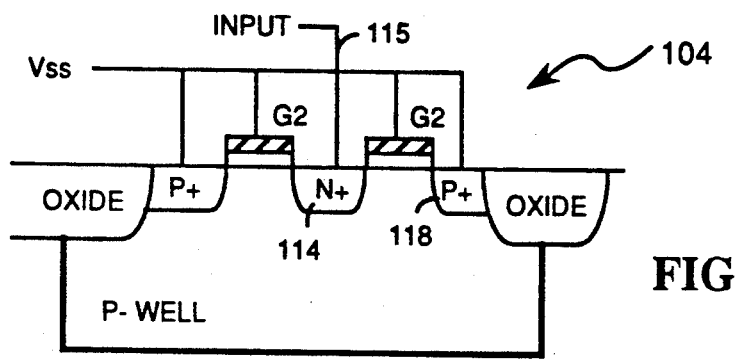

FIGS. 8A and 8B show one preferred embodiment of gated diodes 102 and 104. Each of these gated diodes has a gate G1 or G2 coupled to a voltage source Vcc or Vss, and a drain 112 or 114 coupled to an input signal line 115. The "source" regions 116 and 118 of each of these true gated diodes have the same doping polarity as the neighboring substrate 120 or 121 and therefore do not function as an MOS transistor source, but rather function as a voltage supply connection to the substrate.

Figure 8C:
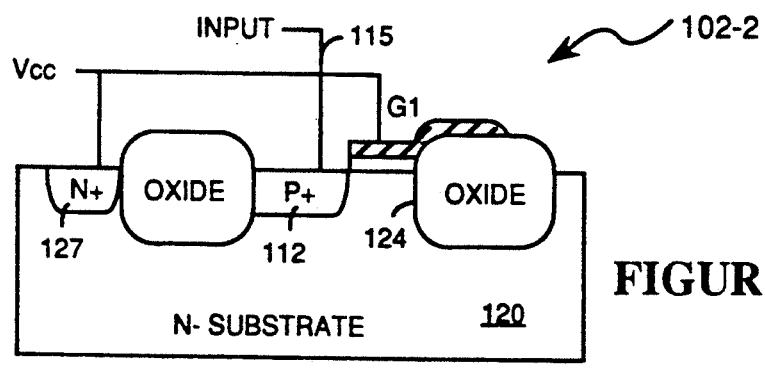
Figure 8D:
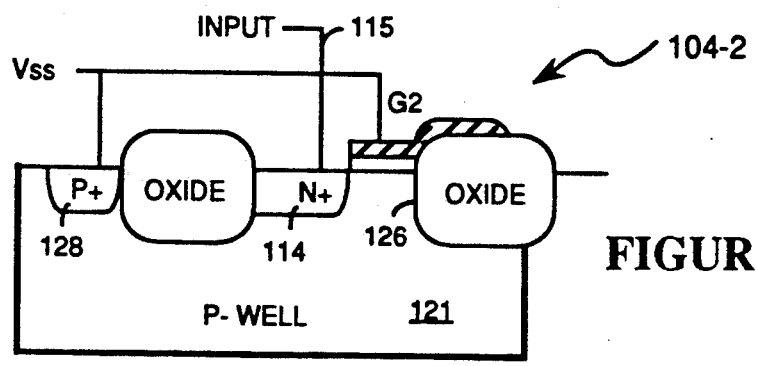

FIGS. 8C and 8D show a second preferred embodiment of a pair of gated diodes 102-2 and 104-2. As before, these gated diodes each has a gate G1 or G2 coupled to a voltage source Vcc or Vss, and a drain 112 or 114 coupled to an input signal line 115. However, these gated diodes have no "source" regions 116 and 118 at all. Instead, the gates G1 and G2 are adjacent to field oxide regions 124 and 126. Of course, the neighboring substrate 120 or 121 must still be coupled to the same voltage source Vcc or Vss as the gate G1 or G2, using N+ and P+ regions 127 and 128. Since these true gated diodes have no "source" regions, there is no associated parasitic lateral bipolar transistor.

The most important characteristic of the true gated diodes used in the present invention, as compared with the gated MOS devices used in the prior art CMOS input protection circuits, is the removal of the lateral parasitic bipolar transistor from underneath the gate oxide. This is accomplished by forming a gated diode without a source region of the same doping polarity as the drain. The lack of a lateral parasitic bipolar transistor reduces the amount of stress on the diode's gate oxide, which is the weakest part of that type of semiconductor structure.

Referring back to FIG. 6A, it has been found by the inventor that the gated diodes 102 and 104 are so efficient at absorbing ESD discharges that no input resistor is required to protect a typical CMOS circuit. However, where a small input resistor (on the order of five to twenty ohms) will not hurt the protected circuit's performance, it is sometimes preferred to include an input resistor because it provides an additional layer of protection. For very high speed devices, such as video RAMs, it is preferred to use the version of the input protection circuit 110 shown in FIG. 6A, which does not include an input resistor.

FIG. 6B shows a second input protection circuit 110 which differs from the circuit 100 in FIG. 6A in that this circuit has an input resistor RI coupled to input pad 101. The resistor RI couples the input pad 101 to two complementary "true gated diodes" 102 and 104. Resistor RI preferably has a resistance of less than 200 ohms, and between 5 and 20 ohms in high speed devices. In one preferred embodiment, the resistor RI is less than 100 ohms and the true gated diodes are each sized so as to be able to nondestructively absorb a peak electrostatic discharge current of at least 2.6 amperes. The resistor RI comprises a diffusion region coupled to the input pad at a defined location, and a diffused well under at least a portion of the diffusion region, including the defined coupling location, so as to prevent metal spike-through when ESD discharges occur.

FIG. 7 depicts the profile and parasitic bipolar transistor model of the input protection circuit 110 shown in FIG. 6A. Resistors R1, R2, R3 and R4 correspond to the bulk resistance of the substrate 120. Parasitic bipolar transistors Q3 and Q4 are operatively the same of as the vertical parasitic bipolar transistors Q3 and Q4 shown in FIGS. 4 and 5. Furthermore, while not explicitly shown in FIG. 7, it is assumed that a set of guard rings 122 will be placed between the input protection circuit and the protected circuit 130 so as to prevent latchup. The protected circuit shown in FIG. 7 is a CMOS inverter comprising transistors M3 and M4. The gates of M3 and M4 are coupled to the input line INPUT. The drains of M3 and M4 are coupled to each other and to an output node OUT. The sources of M3 and M4 are coupled to the power supply nodes Vcc and Vss, respectively.

As shown, true gated diode 102 has a gate G1 with a P+ region 132 on one side and an N+ doped region 134 on the other side of the gate. Gate G1 and N+region 134 are coupled to Vcc while P+region 132 is coupled to the input line INPUT. The P+ and N+ regions 132 and 134 are formed using standard masking and ion implant techniques.

Similarly, true gated diode 104 has a gate G2 with an N+ region 142 on one side and an P+doped region 144 on the other side of the gate. Gate G2 and P+region 144 are coupled to Vss while N+ region 142 is coupled to the input line INPUT.

In the preferred embodiment, the two true gated diodes 102 and 104 have polysilicon gates shaped so that the input node of each gated diode is completely surrounded by a polysilicon gate and so that there is no corner at which the polysilicon gate crosses a doped node—field oxide boundary. The polysilicon gates have rounded corners at the boundary of the surrounded doped nodes.

When an ESD voltage is coupled to the input signal line 150, the forward biased diode 102 or 104 will absorb the bulk of the ESD current. However, the response time and effective resistance of the forward biased diode may allow the input voltage to reach the breakdown voltage of the reverse biased gated diode 102 or 104, which will then shunt the rest of the ESD current before the gate oxide rupture voltage is reached. In addition, a corresponding vertical bipolar transistor may be activated. As a result, most of the ESD current will flow into the substrate, and very little current, if any, will flow along the surface of the substrate under the gate oxide 152 or 154. Thus, the ESD current cannot damage the gate oxide, eliminating one of the main causes of circuit failures in the prior art.

In addition, since there are no lateral bipolar parasitic transistors associated with the true gated diodes 102 and 104, there is no latchup or SCR problem associated with the prior art input protection devices, as described above with reference to FIG. 4.

Thus, in summary, the present invention's use of a pair a complementary true gated diodes eliminates the gate oxide failure and latchup problems associated with prior art input protection circuits that use complementary diodes.

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

In particular, it should be noted that if the present invention is used in a device with a P type substrate, the same input protection circuit and layout could be used so long as the P and N diffusion or doping types are swapped.

What is claimed is:

1. In an MOS semiconductor circuit, an input protection circuit coupled to an input pad and to other circuitry in the MOS semiconductor circuit, said MOS semiconductor circuit including a high voltage source node and a low voltage source node; said input protection circuit comprising:

an input node coupled to an input pad;
two complementary true gated diodes, including a first true gated diode having a P-doped drain node coupled to said input node and a gate node coupled to said high voltage power supply node, and a second true gated diode having a N-doped drain node coupled to said input node and a gate node coupled to said second power supply node.

2. An input protection circuit as set forth in claim 1, wherein said true gated diodes each have an underlying vertical parasitic bipolar transistor but no underlying lateral parasitic bipolar transistor.

3. An input protection circuit as set forth in claim 1, including an input resistor, having a resistance of less than 200 ohms, coupling said input pad to said input node.

4. An input protection circuit as set forth claim 1, including an input resistor having a resistance of less than 100 ohms coupling said input pad to said input node, wherein said first and second true gated diodes are sized so as to be able to nondestructively absorb a peak electrostatic discharge current of at least 2.6 amperes.

5. In an MOS semiconductor circuit, an input protection circuit coupled to an input pad and to other circuitry in the MOS semiconductor circuit, said MOS semiconductor circuit including a high voltage source node and a low voltage source node; said input protection circuit comprising:

an input node coupled to an input pad;
two complementary true gated diodes, including (1) a first true gated diode having a P-doped drain node coupled to said input node, an insulated gate node coupled to said high voltage power supply node, and an N-doped source node, and (2) a second true gated diode having a N-doped drain node, an insulated gate node coupled to said second power supply node, and an P-doped source node.

6. An input protection circuit as set forth in claim 5, wherein said true gated diodes each have an underlying vertical parasitic bipolar transistor but no underlying lateral parasitic bipolar transistor.

7. An input protection circuit as set forth in claim 5, including an input resistor, having a resistance of less than 200 ohms, coupling said input pad to said input node.

8. An input protection circuit as set forth in claim 5, including an input resistor having a resistance of less than 100 ohms coupling said input pad to said input node, wherein said first and second true gated diodes are sized so as to be able to nondestructively absorb a peak electrostatic discharge current of at least 2.6 amperes.

9. In an MOS semiconductor circuit, an input protection circuit coupled to an input pad and to other circuitry in the MOS semiconductor circuit, said MOS semiconductor circuit including a high voltage source node and a low voltage source node; said input protection circuit comprising:

an input node coupled to an input pad;
two complementary true gated diodes, including (1) a first true gated diode having a P-doped drain region, an insulated gate node coupled to said high voltage source node, and no source region, and (2) a second true gated diode having a N-doped drain region, an insulated gate node coupled to said second power supply node and no source region.

10. An input protection circuit as set forth in claim 9, wherein said true gated diodes each have an underlying vertical parasitic bipolar transistor but no underlying lateral parasitic bipolar transistor.

11. An input protection circuit as set forth in claim 9, including an input resistor, having a resistance of less than 200 ohms, coupling said input pad to said input node.

12. An input protection circuit as set forth claim 9, including an input resistor having a resistance of less than 100 ohms coupling said input pad to said input node, wherein said first and second true gated diodes are sized so as to be able to nondestructively absorb a peak electrostatic discharge current of at least 2.6 amperes.

13. An input protection circuit formed along the periphery of a CMOS semiconductor circuit, coupling an input pad to circuitry in the interior portion of the CMOS semiconductor circuit, said CMOS semiconductor circuit including a high voltage source node and a low voltage source node; said input protection circuit comprising:
an input connector, having a resistance of less than 20 ohms, coupling an input pad to an input node; and
two complementary true gated diodes, including a first true gated diodes having a P-doped drain node coupled to said input node and a gate node coupled to said high voltage power supply node, and a second true gated diode having a N-doped drain node coupled to said input node and a gate node coupled to said second power supply node.

14. An input protection circuit as set forth in claim 13, wherein said true gated diodes each have an underlying vertical parasitic bipolar transistor but no underlying lateral parasitic bipolar transistor.

15. An input protection circuit formed along the periphery of a CMOS semiconductor circuit, coupling an input pad to circuitry in the interior portion of the CMOS semiconductor circuit, said CMOS semiconductor circuit including a high voltage source node and a low voltage source node; said input protection circuit comprising:
an input connector, having a resistance of less than 20 ohms, coupling an input pad to an input node; and
two complementary true gated diodes, including (1) a first true gated diode having a P-doped drain region, an insulated gate node coupled to said high voltage power supply node, and an N-doped source region, and (2) a second true gated diode having a N-doped drain region, an insulated gate node coupled to said second power supply node, and an P-doped source region.

16. An input protection circuit as set forth in claim 15, wherein said true gated diodes each have an underlying vertical parasitic bipolar transistor but no underlying lateral parasitic bipolar transistor.

17. An input protection circuit formed along the periphery of a CMOS semiconductor circuit, coupling an input pad to circuitry in the interior portion of the CMOS semiconductor circuit, said CMOS semiconductor circuit including a high voltage source node and a low voltage source node; said input protection circuit comprising:
an input connector, having a resistance of less than 20 ohms, coupling an input pad to an input node; and
two complementary true gated diodes, including (1) a first true gated diode having a P-doped drain region, an insulated gate node coupled to said high voltage power supply node, and no source region, and said second true gated diode having a N-doped drain region, an insulated gate node coupled to said second power supply node, and no source region.

18. An input protection circuit as set forth in claim 17, wherein said true gated diodes each have an underlying vertical parasitic bipolar transistor but no underlying lateral parasitic bipolar transistor.

* * * * *